United States Patent
Wu et al.

(10) Patent No.: US 9,691,721 B2
(45) Date of Patent: *Jun. 27, 2017

(54) JOG DESIGN IN INTEGRATED CIRCUITS

(71) Applicant: Taiwan Semiconductor Manufacturing Company, Ltd., Hsin-Chu (TW)

(72) Inventors: Tsung-Lin Wu, Taichung (TW); Tung-Heng Hsieh, Zhudong Town (TW); Jiun-Ming Kuo, Taipei (TW); Min-Hsiung Chiang, Taipei (TW); Che-Yuan Hsu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/166,528

(22) Filed: May 27, 2016

(65) Prior Publication Data
US 2016/0276297 A1    Sep. 22, 2016

Related U.S. Application Data

(63) Continuation of application No. 14/556,921, filed on Dec. 1, 2014, now Pat. No. 9,355,912, which is a (Continued)

(51) Int. Cl.
*H01L 21/3205* (2006.01)
*H01L 21/4763* (2006.01)
*H01L 23/58* (2006.01)
*H01L 29/66* (2006.01)
*H01L 29/78* (2006.01)
*H01L 21/768* (2006.01)
*H01L 21/8234* (2006.01)
(Continued)

(52) U.S. Cl.
CPC ...... *H01L 23/585* (2013.01); *H01L 21/76895* (2013.01); *H01L 21/823437* (2013.01); *H01L 21/823475* (2013.01); *H01L 23/5386* (2013.01); *H01L 27/0207* (2013.01); *H01L 27/088* (2013.01); *H01L 29/0649* (2013.01); *H01L 29/4238* (2013.01); *H01L 29/66477* (2013.01); *H01L 29/78* (2013.01); *H01L 29/7833* (2013.01)

(58) Field of Classification Search
USPC ....... 257/901, 213–413, 900, 902, 903, 139, 257/192; 365/104; 438/172, 292–308
See application file for complete search history.

(56) References Cited

U.S. PATENT DOCUMENTS 8,901,627 B2 * 12/2014 Wu ............... H01L 29/66477
257/288
2007/0120156 A1    5/2007 Liu et al.
(Continued)

*Primary Examiner* — Tram H Nguyen
(74) *Attorney, Agent, or Firm* — Slater Matsil, LLP

(57) ABSTRACT

A device includes an active region in a semiconductor substrate, a gate strip over and crossing the active region, and a jog over the active region and connected to the gate strip to form a continuous region. The jog is on a side of the gate strip. A first contact plug is at a same level as the gate strip, wherein the first contact plug is on the side of the gate strip. A second contact plug is over the jog and the first contact plug. The second contact plug electrically interconnects the first contact plug and the jog.

20 Claims, 12 Drawing Sheets

Related U.S. Application Data continuation of application No. 13/679,238, filed on Nov. 16, 2012, now Pat. No. 8,901,627.

(51) Int. Cl.
*H01L 27/02* (2006.01)
*H01L 29/423* (2006.01)
*H01L 23/538* (2006.01)
*H01L 27/088* (2006.01)
*H01L 29/06* (2006.01)

(56) References Cited

U.S. PATENT DOCUMENTS

| | | | |
|---|---|---|---|
| 2011/0042752 A1* | 2/2011 | Mayuzumi | H01L 21/28518 257/369 |
| 2011/0140203 A1 | 6/2011 | Hou et al. | |
| 2011/0215384 A1 | 9/2011 | Ohmi et al. | |
| 2011/0248321 A1 | 10/2011 | Guo et al. | |
| 2012/0280290 A1 | 11/2012 | Khakifirooz et al. | |
| 2012/0280291 A1 | 11/2012 | Lee et al. | |
| 2012/0299069 A1 | 11/2012 | Kuhn et al. | |
| 2013/0285125 A1 | 10/2013 | Chen et al. | |
| 2013/0307032 A1* | 11/2013 | Kamineni | H01L 23/485 257/288 |

* cited by examiner

JOG DESIGN IN INTEGRATED CIRCUITS

PRIORITY CLAIM AND CROSS-REFERENCE

This application is a continuation of U.S. patent application Ser. No. 14/556,921, entitled "Jog Design in Integrated Circuits," filed Dec. 1, 2014, which is a continuation of U.S. patent application Ser. No. 13/679,238, entitled "Jog Design in Integrated Circuits," filed on Nov. 16, 2012, now U.S. Pat. No. 8,901,627, which are incorporated herein by reference.

BACKGROUND

To electrically short an active region of a Metal-Oxide-Semiconductor (MOS) device to a gate electrode strip, a butted contact plug may be formed to interconnect the active region and the gate electrode strip. Conventionally, the active region and the gate electrode strip were connected to electrical ground for device isolation purpose.

In the conventional structures, the gate electrode strip that was used for the device isolation was formed over a Shallow Trench Isolation (STI) region. The STI region requires more chip area than the gate electrode strip. This causes the adverse reduction in the device density.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Metal-Oxide-Semiconductor (MOS) devices and isolation structures and the method of forming the same are provided in accordance with various exemplary embodiments. The intermediate stages of forming the MOS devices and the isolation structures are illustrated. The variations of the embodiments are discussed. Throughout the various views and illustrative embodiments, like reference numbers are used to designate like elements.

Figure 1A:
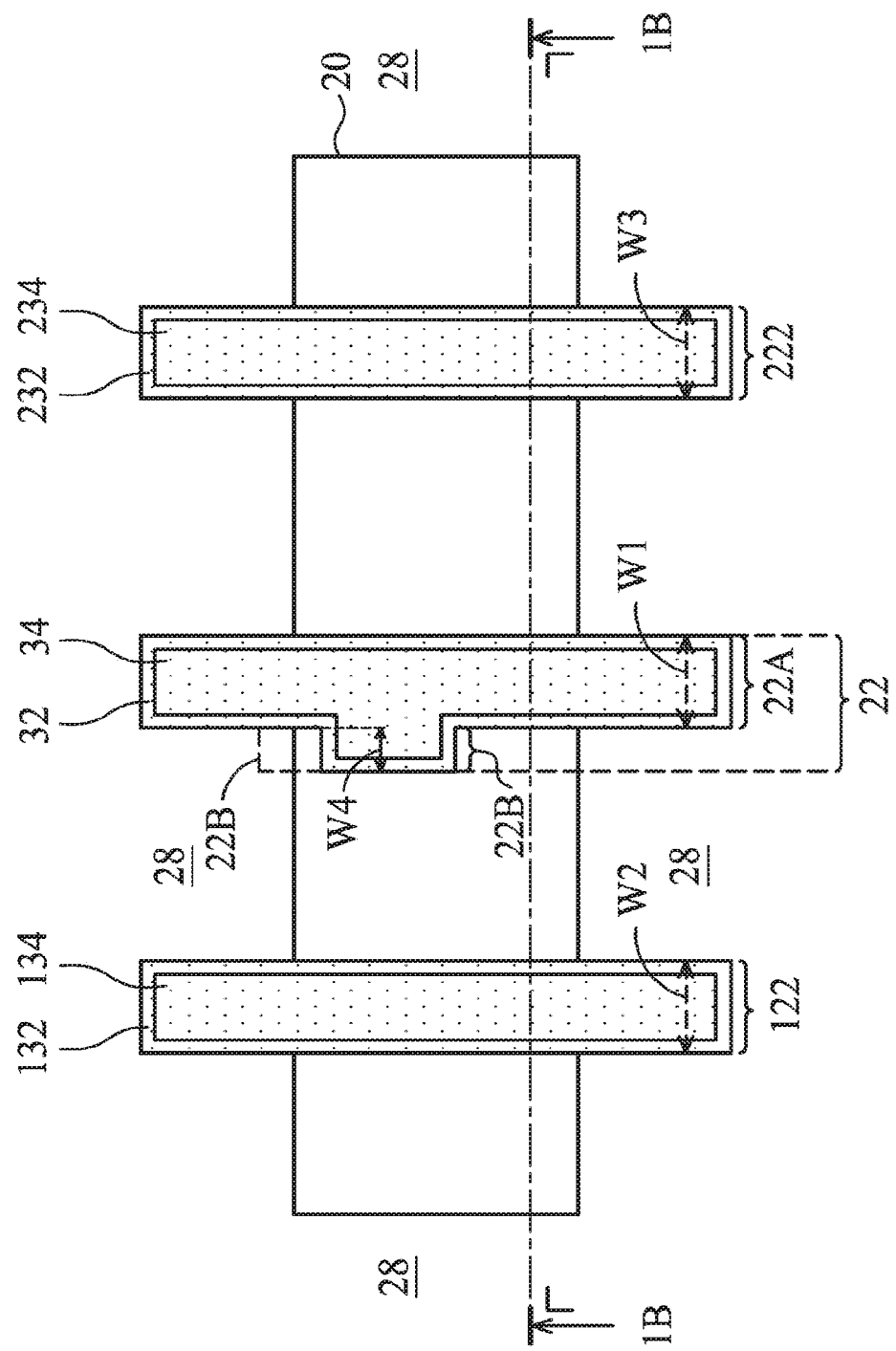
FIGS. 1A through 6 are top views and cross-sectional views of intermediate stages in the manufacturing of Metal-Oxide-Semiconductor (MOS) devices and a device isolation structure in accordance with some exemplary embodiments.

FIG. 1A illustrates gate strips 22, 122 and 222 formed over active region 20. In some embodiments, active region 20 is a continuous active region, which is formed of a semiconductor material. Active region 20 is defined by, for example, encircled by, isolation regions 28. Gate strips 22, 122 and 222 have longitudinal directions parallel to each other. Each of gate strips 22, 122 and 222 may include a portion overlapping active region 20, and portions overlapping isolation regions 28, which may be, for example, Shallow Trench Isolation (STI) regions.

Gate strips 122 and 222 may have uniform widths W2 and W3, respectively. Gate strip 22 may include strip portion 22A and jog 22B connected to strip portion 22A. Strip portion 22A may have width W1 equal to widths W2 and W3. Furthermore, strip portion 22A and gate strips 122 and 222 may be equally spaced, although the spacings therebetween may also be different. Jog 22B and strip portion 22A are continuously connected, with no interface formed therebetween. Jog 22B has width W4, wherein ratio W4/W1 may be greater than about 0.13, and may be between 0.13 and about 0.55. In some exemplary embodiments, width W4 is between about 2.5 nm and about 10 nm, and widths W1, W2, and W3 may be between about 18 nm and about 20 nm. It is appreciated, however, that the values recited throughout the description are merely examples, and may be changed to different values. An entirety of jog 22B may be aligned to, and overlap, active region 20, although a portion of jog 22B may extend to overlap STI region 28, wherein dashed lines indicate the respective edges of jog 22B.

Gate strip 22 includes gate dielectric 32 and gate electrode 34. Gate strip 122 includes gate dielectric 132 and gate electrode 134. Gate strip 222 includes gate dielectric 232 and gate electrode 234. In some embodiments, gate strips 22, 122, and 222 are replacement gates that are formed using a gate-last approach. Accordingly, gate dielectric 32 comprises a bottom portion (FIG. 1B) overlapped by gate electrode 34, and sidewall portions on the sidewalls of gate electrode 34. Similarly, gate dielectric 132 comprises a bottom portion (FIG. 1B) overlapped by gate electrode 134, and sidewall portions on the sidewalls of gate electrode 134, and gate dielectric 232 comprises a bottom portion overlapped by gate electrode 234, and sidewall portions on the sidewalls of gate electrode 234. In Alternative embodiments, gate strips 22, 122, and 222 are formed using a gate-first approach. Accordingly, gate dielectrics 32, 132, and 232 do not comprise portions of sidewalls of the respective gate electrode 34, 134, and 234. Entireties of gate electrodes 34, 134, and 234 are formed of a same material, and are formed simultaneously. Entireties of gate dielectrics 32, 132, and 232 are formed of a same material, and are formed simultaneously.

Figure 1B:
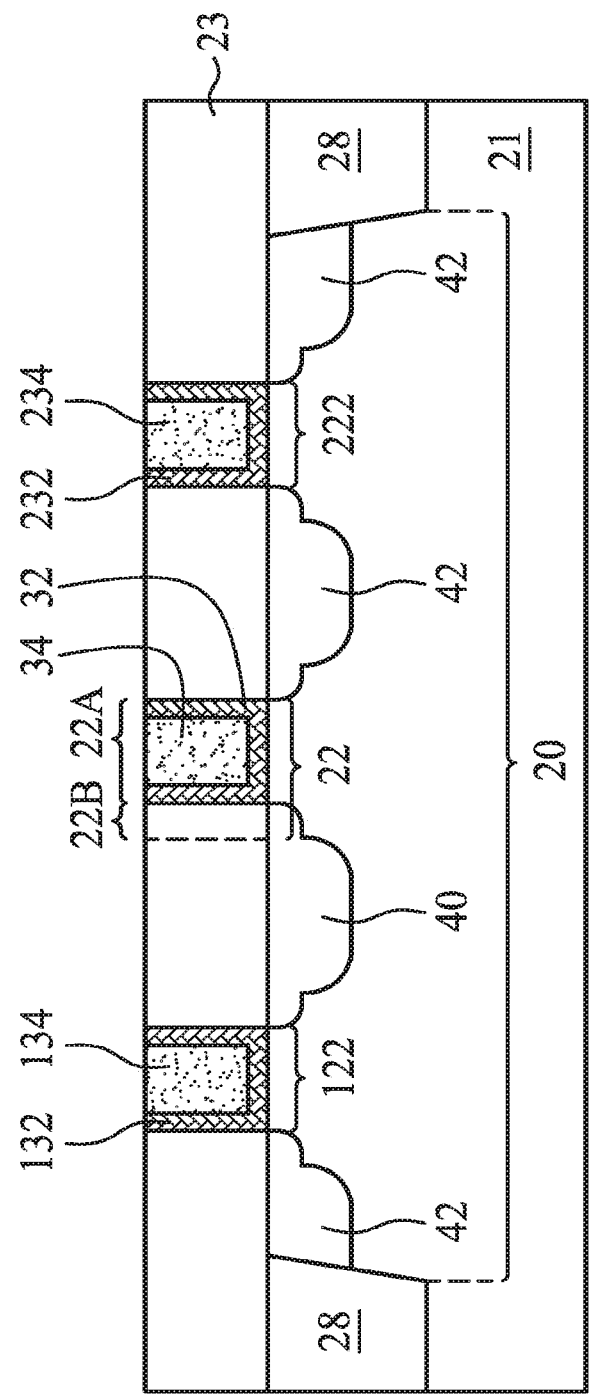

FIG. 1B illustrates a cross-sectional view of the structure in FIG. 1A, wherein the cross-sectional view is obtained from the plane crossing line 1B-1B in FIG. 1A. As shown in FIG. 1B, gate strips 22, 122, and 222 are formed over active region 20, which is a part of substrate 21. In some embodiments, substrate 21 is a semiconductor substrate, and may be a silicon substrate, a silicon germanium substrate, a III-V compound semiconductor substrate, etc. Since jog 22B is not in the illustrated plane, an edge of jog 22B is illustrated using a dashed line. Source and drain regions 40 and 42 are formed in active region 20. Source and drain regions 40 and 42 are referred to as source/drain regions 40 and 42 throughout the description to indicate that each of them may be a source region or a drain region. Gate strips 22, 122, and 222 are formed in Inter-Layer Dielectric (ILD, referred to as ILD0 hereinafter) 23, wherein ILD 23 may be formed of an oxide such as Phospho-Silicate Glass (PSG), Boro-Silicate Glass (BSG), Boron-Doped Phospho-Silicate Glass (BPSG), tetraethyl orthosilicate (TEOS), or the like. The formation of gate strips 22, 122, and 222 may include forming dummy gate electrodes (such as dummy polysilicon strips, not shown) over active region 20 and STI 28, forming ILD 23, removing the dummy gate electrodes to form openings in ILD 23, filling a gate dielectric layer and a conductive material in ILD 23, and performing a Chemical Mechanical Polish (CMP) to remove excess portions of the conductive material and the gate dielectric layer over ILD 23.

Figure 2A:
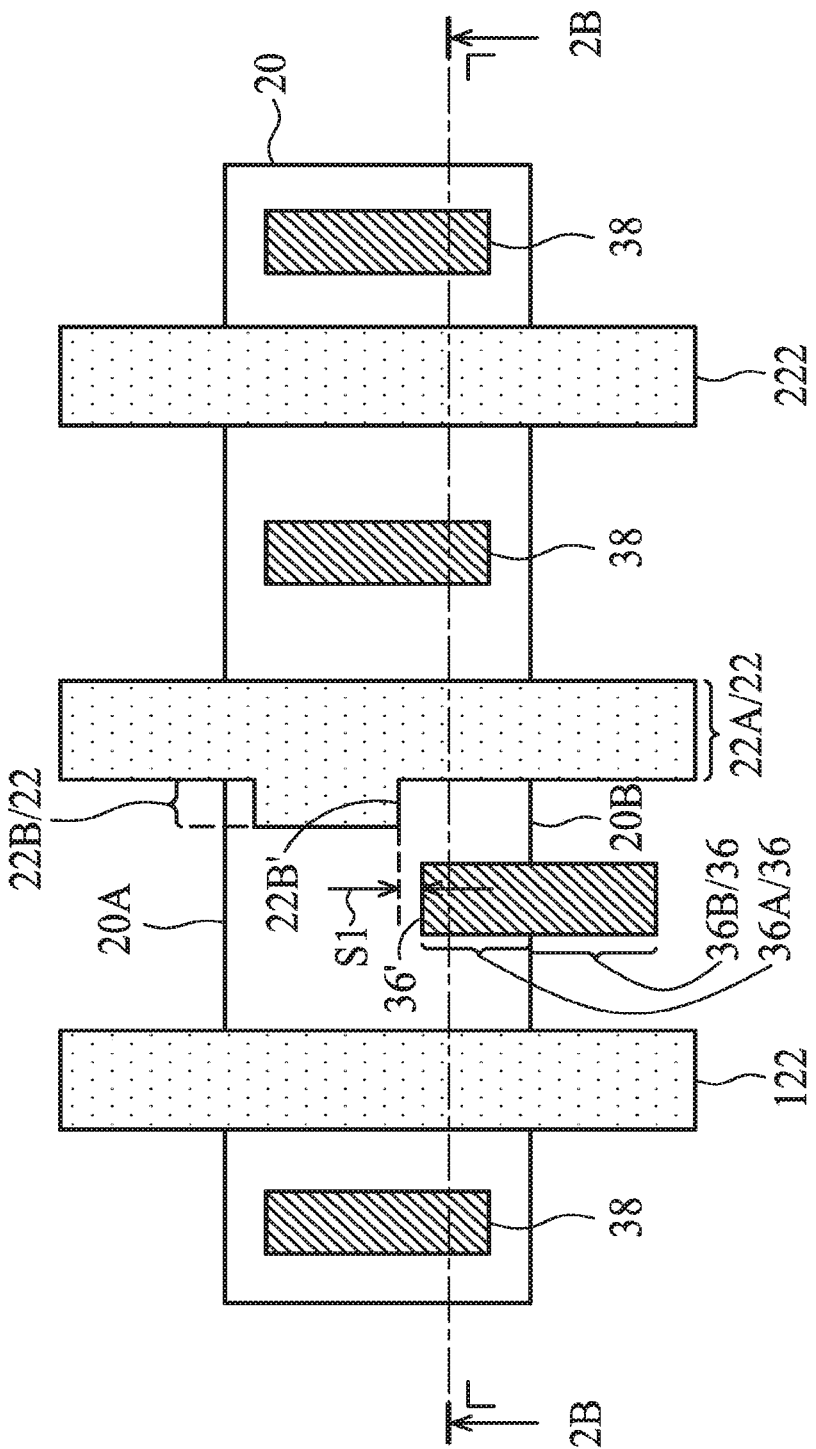

FIG. 2A illustrates the formation of contact plugs (sometimes referred to as M0_OD1) 36 and 38. M0_OD1 36 comprises portion 36A overlapping active region 20. In some embodiments, M0_OD1 36 further comprises portion 36B overlapping a portion of STI region 28 (as marked FIG. 1A). In alternative embodiments, portion 36B is not formed, and an entirety of M0_OD1 36 overlaps active region 20. In some embodiments, M0_OD1 36 is misaligned from jog 22B. For example, edge 36' of M0_OD1 36 and the extension line of edge 22B' of jog 22B are spaced apart from each other by distance S1, which is equal to or greater than 0 nm, and may be greater than about 2 nm. Furthermore, in the top view as in FIG. 2A, M0_OD1 36 is closer to edge 20B of active region 20 than an entirety of jog 22B, and jog 22B is closer to edge 20A of active region 20 than the portion of M0_OD1 36 overlapping active region 20. M0_OD1 38 may have entireties overlapping active region 20. Accordingly, M0_OD1 36 may also be misaligned to M0_OD1s 38.

Figure 2B:
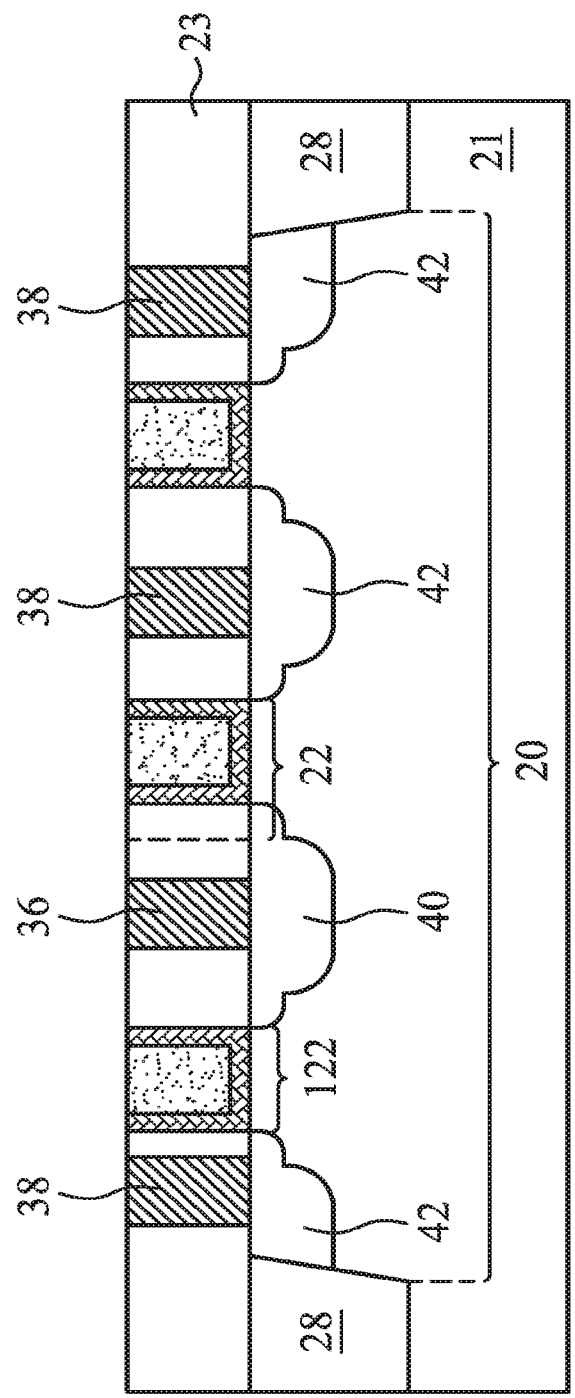

FIG. 2B illustrates a cross-sectional view of the structure in FIG. 2A, wherein the cross-sectional view is obtained from the plane crossing line 2B-2B in FIG. 2A. M0_OD1 36 is over, and electrically coupled to, source/drain region 40, which is the common source/drain region shared by gate strips 22 and 122. A silicide region (not shown) may be formed between, and in contact with, M0_OD1 36 and the underlying source/drain region 40. M0_OD1s 38 are over, and electrically coupled to, the respective underlying source/drain regions 42. Silicide regions (not shown) may be formed between, and in contact with, M0_OD1 38 and the underlying source/drain region 42. M0_OD1s 36 and 38 are formed in ILD 23 by forming openings in ILD 23, and filling a conductive material in ILD 23, followed by a CMP.

Figure 4A:
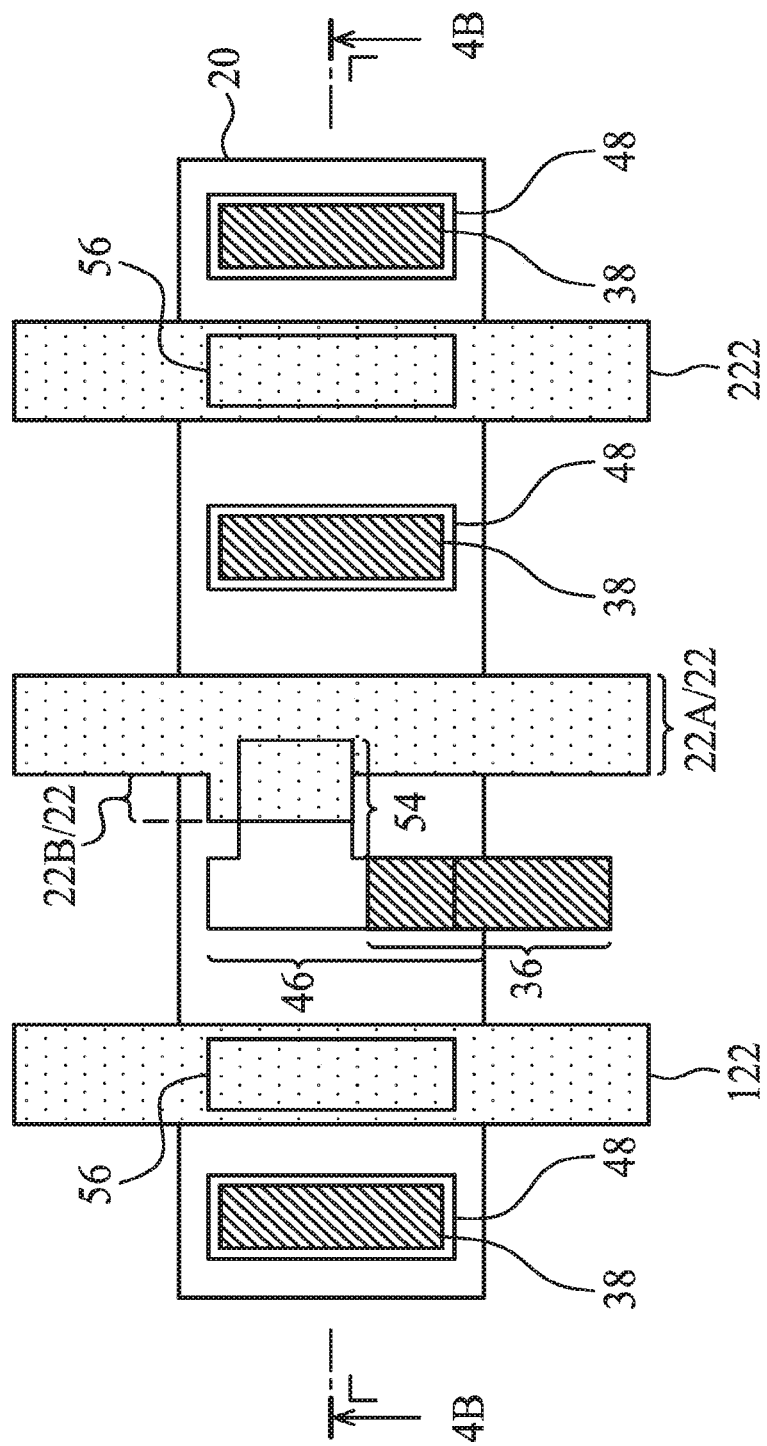
Figure 4B:
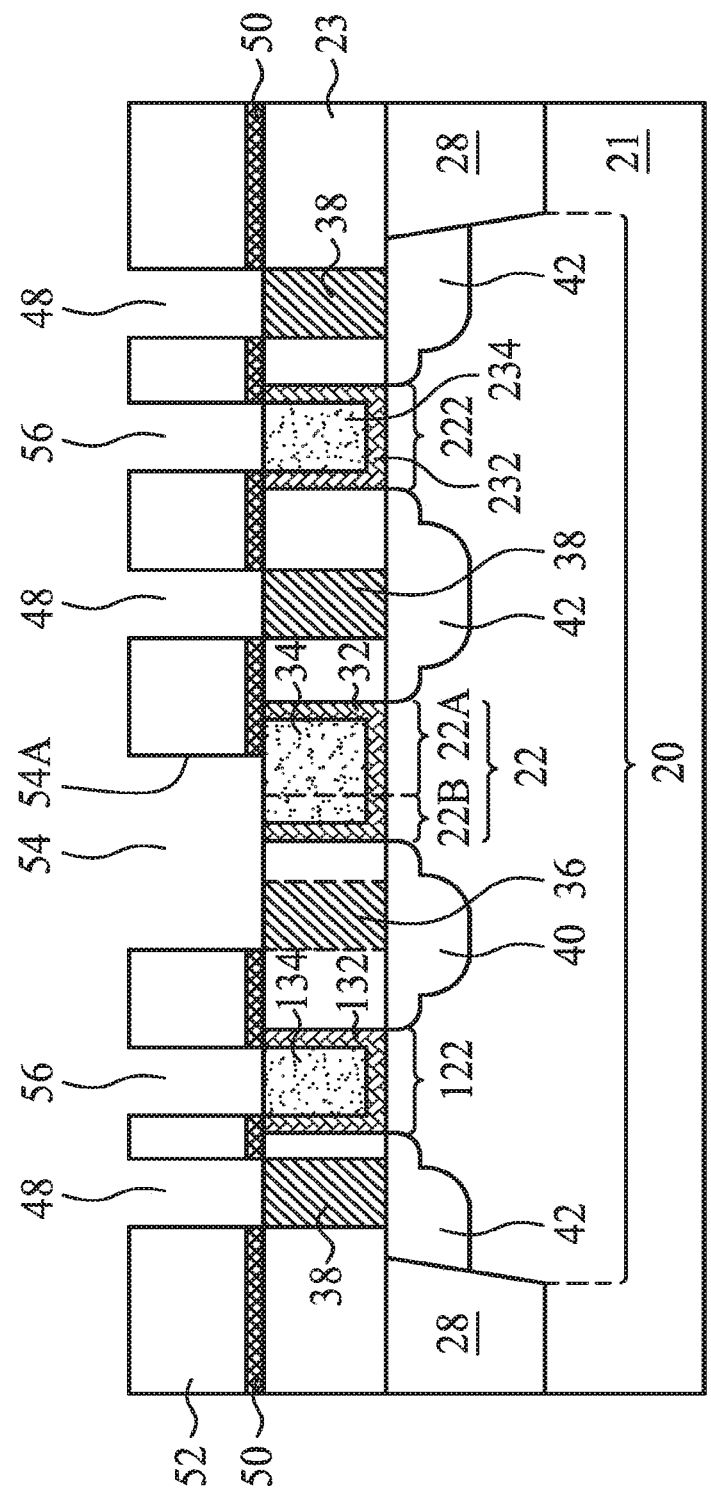
Figure 5A:
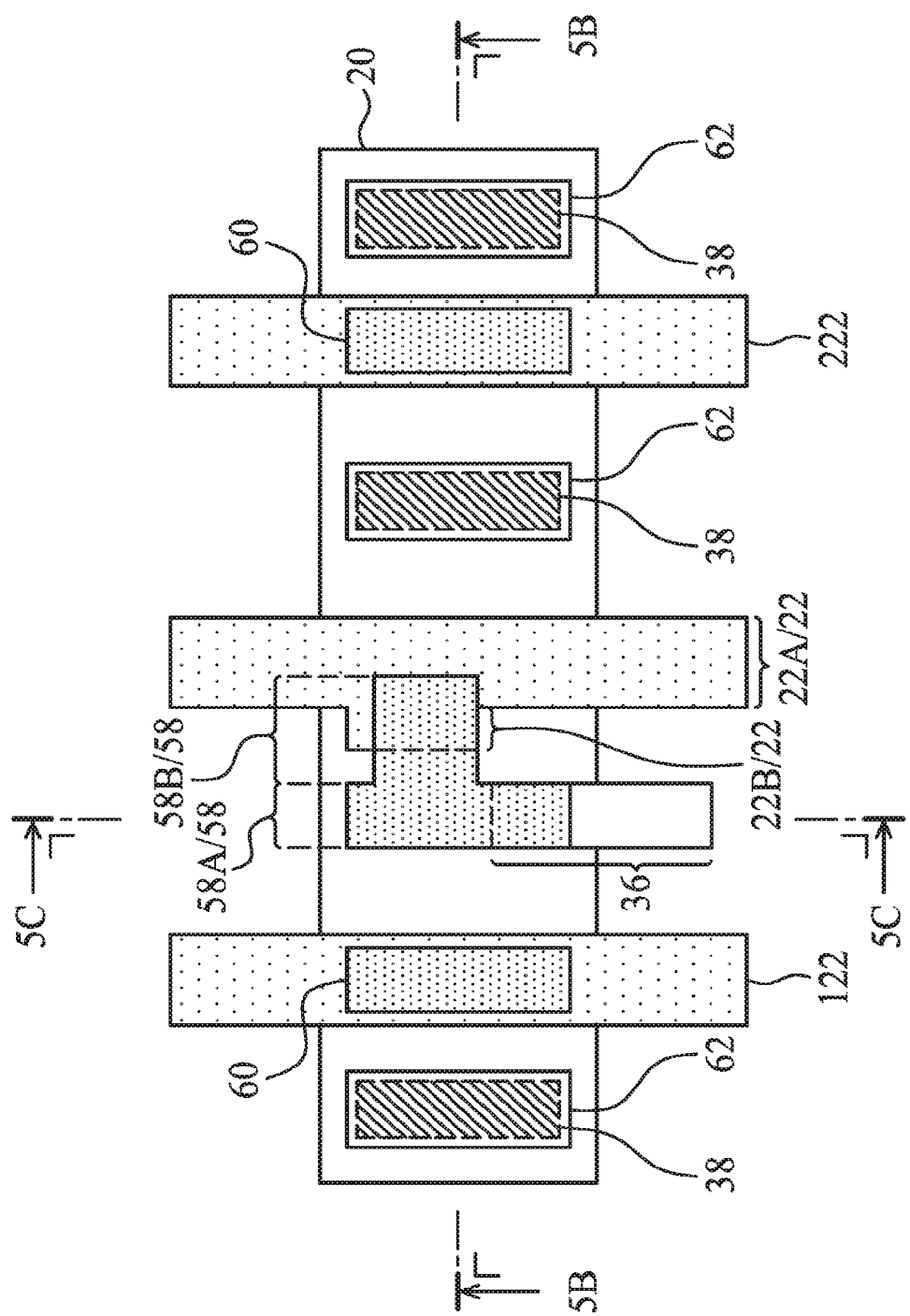

FIGS. 3A through 5C illustrate the formation of contact plugs 58, 60, and 62 (FIG. 5A). Referring to FIG. 3B, which is a cross-sectional view, Etch Stop Layer (ESL) 50 and ILD 52 are formed over ILD 23 and M0_OD1 36 and 38. Etch stop layer 50 may comprise silicon carbon, silicon nitride, silicon oxynitride, or the like. ILD 52 may be formed of a dielectric material selected from the same candidate materials for forming ILD 23. Contact plug openings 46 and 48 are formed in ESL 50 and ILD 52, so that M0_OD1s 36 and 38 are exposed. Contact plug openings 46 and 48 may be formed by etching ILD 52 using ESL 50 as an etch stop layer, and then etching ESL 50.

Figure 3A:
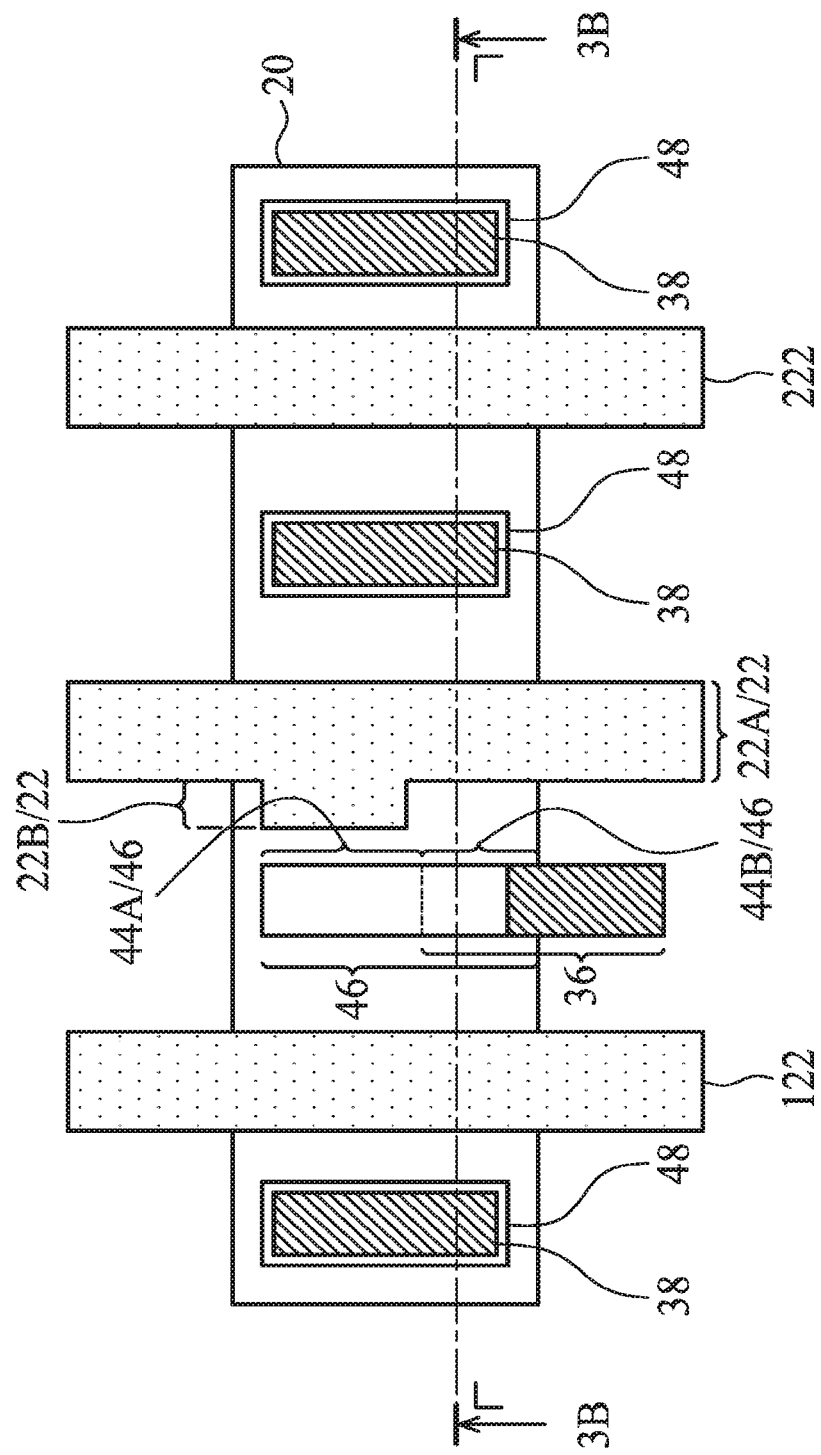
Figure 3B:
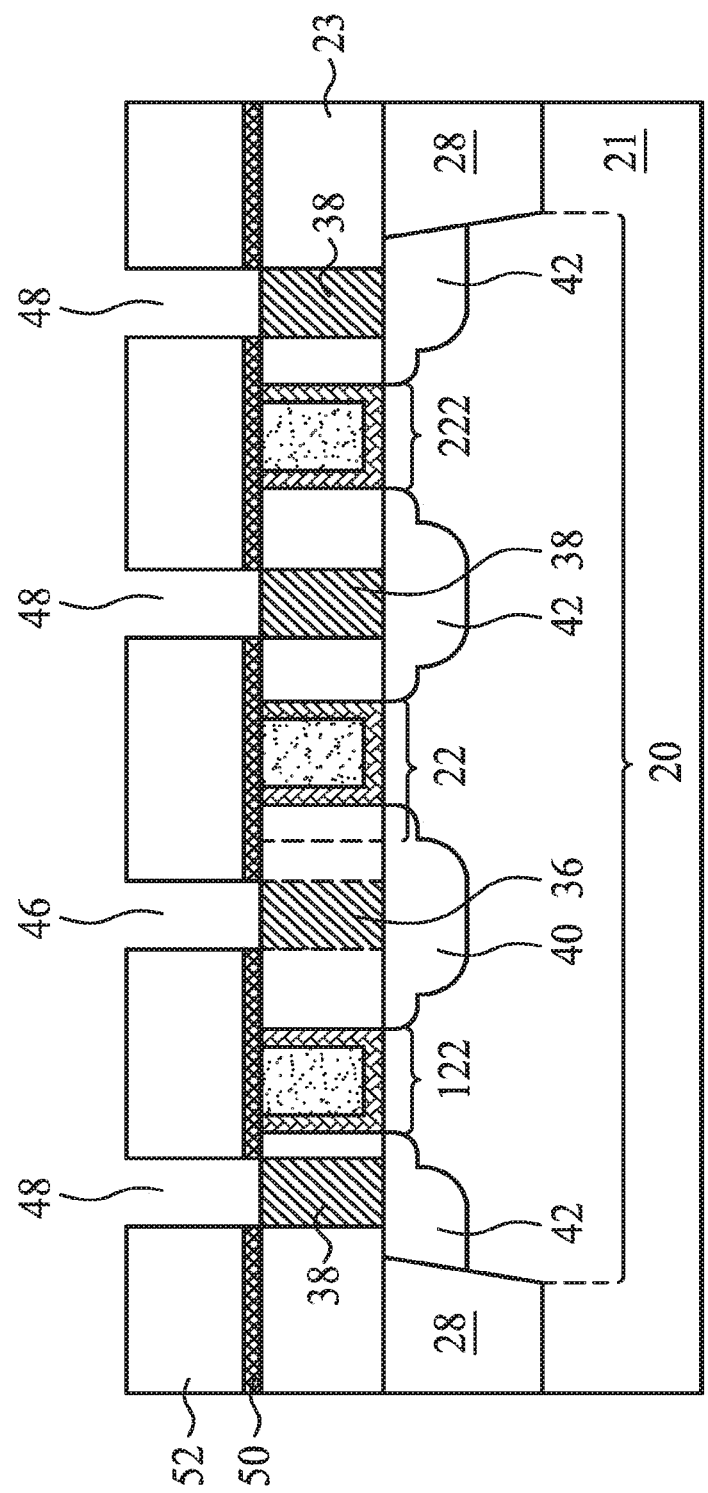

FIG. 3A illustrates a top view of the structure in FIG. 3B, wherein the cross-sectional view in FIG. 3B is obtained from the plane crossing line 3B-3B in FIG. 3A. In some embodiments, contact plug openings 48 are aligned to the corresponding underlying M0_OD1 38. For clarity, contact plug openings 48 are shown as having top-view sizes slightly greater than the corresponding underlying M0_OD1s 38. Contact plug openings 48 may also have top-view sizes and top-view shapes equal to, or smaller than, that of M0_OD1s 38.

Contact plug opening 46 includes first portion 46A misaligned with M0_OD1 36, and second portion 46B aligned to a portion of M0_OD1 36. M0_OD1 36 is thus exposed through contact plug opening 46. Furthermore, a portion of contact plug opening 46 is aligned with a portion of jog 22B, which means that the portion of contact plug opening 46 and the portion of jog 22B have equal distances from edges 20A and 20B of active region 20.

FIG. 4A illustrates a top view showing the formation of openings 54 and 56, which are formed simultaneously in a same etching step. Openings 54 and 56 are also referred to as the M0_poly openings 54 and 56 since the contact plugs filled therein comprise portions directly over and connected to gate strips 22, 122, and 222 (which may comprise polysilicon in some embodiments, hence the name "poly"). Opening 54 comprises a portion overlap a portion of opening 46. As a result, opening 46 and 54 in combination form an integrated and continuous opening, which is referred to as opening 46/54 hereinafter. Opening 54 further overlaps jog 22B, and hence jog 22B is exposed through opening 54. Furthermore, gate strip portion 22A may, or may not, comprise a portion exposed through opening 54.

FIG. 4B illustrates a cross-sectional view of the structure in FIG. 4A, wherein the cross-sectional view is obtained from the plane crossing line 4B-4B in FIG. 4A. M0_OD1 36 is not in the illustrated plane, and hence is illustrated using dashed lines. To allow enough process window, edge 54A of opening 54 may be designed to align to a middle line of gate strip portion 22A, so that even if edge 54A shifts to the right due to process variation, edge 54A still overlaps gate strip portion 22A, and will not be shifted to the right of the right edge of gate strip portion 22A.

Next, referring to FIG. 5A, openings 54 and 56 (FIGS. 4A and 4B) are filled to form contact plugs 58 and 60, respectively. At the same time contact plugs 58 and 60 are formed, contact openings 48 (FIGS. 4A and 4B) are also filled to form contact plugs 62, which are also referred to as M0_OD2 hereinafter. The formation process may include filling openings 46, 48, 54, and 56 with a conductive adhesion/barrier layer (comprising titanium or tantalum, for example) and a metallic material such as tungsten or copper, and performing a CMP. Contact plug 58 is overlying, and electrically interconnects, M0_OD1 36 and gate electrode 34. Referring to FIG. 5A, contact plug 58 includes first portion 58A, which is spaced apart from gate strip 22, and second portion 58B connected to first portion 58A. Portions 58A and 58B may form an L-shape in some embodiments. The formation of jog 22B increases the landing area of contact plug 58. As a result, the process window for electrically connecting gate strip 22A and contact plug 36 is increased because contact plug 58 is allowed to move to the left and still lands on jog 22B. The contact resistance between contact plug 58 and gate strip 22A is reduced. Contact plugs 60 are formed over, and are connected to, the respective underlying gate electrodes 134 and 234, respectively.

Figure 5B:
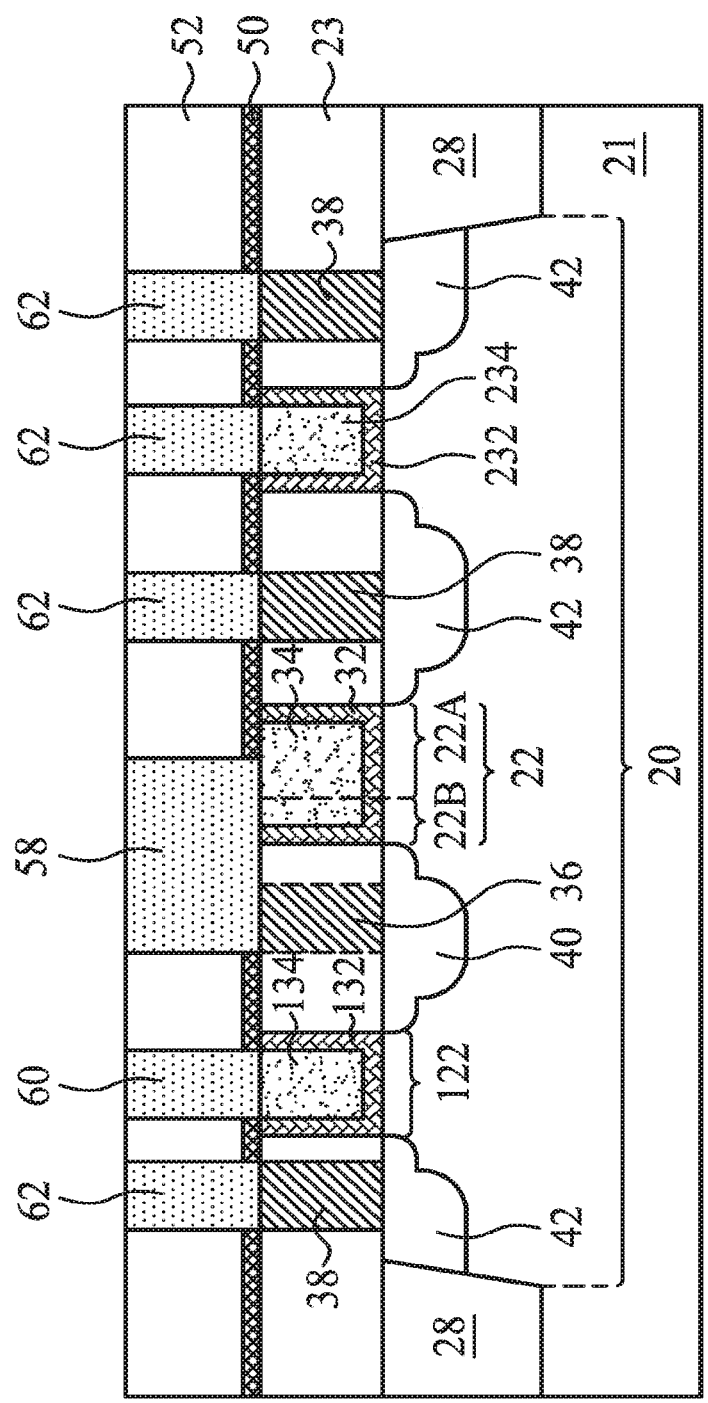

FIG. 5B illustrates a cross-sectional view of the structure in FIG. 5A, wherein the cross-sectional view is obtained from the plane crossing line 5B-5B in FIG. 5A. FIG. 5B illustrates that each of gate electrodes 34, 134, and 234 and M0_OD1 36 and 38 is electrically connected to the respective overlying contact plugs 58, 60, and 62.

Figure 5C:
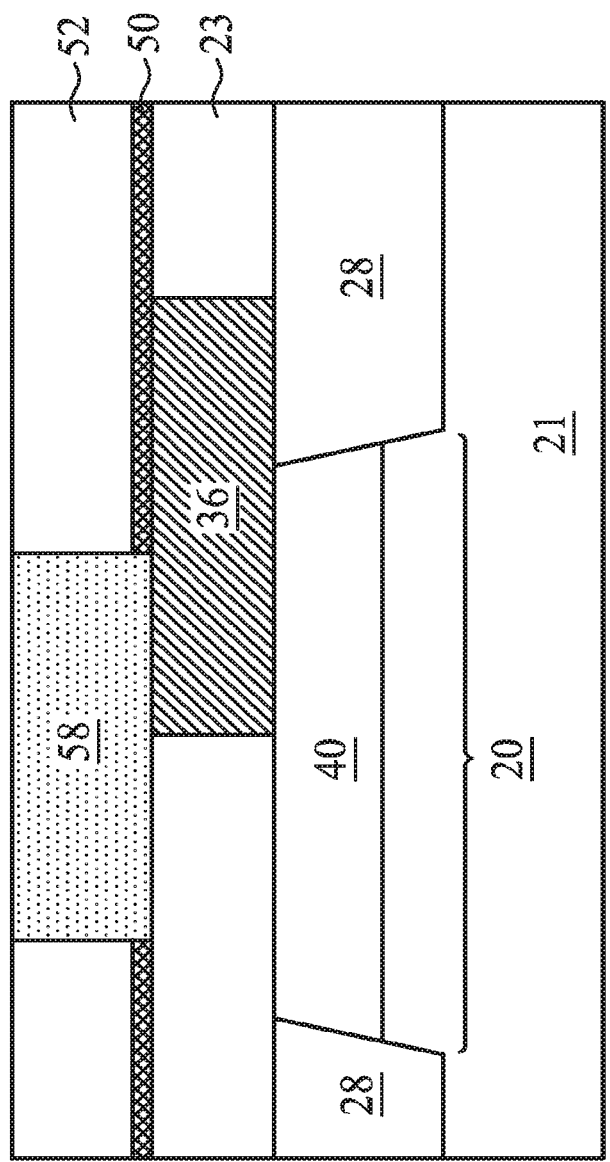

FIG. 5C illustrates a cross-sectional view of the structure in FIG. 5A, wherein the cross-sectional view is obtained from the plane crossing line 5C-5C in FIG. 5A. FIG. 5C shows that contact plug 58 includes a portion overlapping and contacting a portion of M0_OD1 36, and another portion overlapping and contacting ILD 23. Combining FIGS. 5B and 5C, it is observed that contact plug 58 has a bottom surface, which includes a first portion contacting a top surface of a portion of M0_OD1 36 (FIGS. 5B and 5C), a second portion over and contacting a top surface of ILD 23 (FIG. 5C), and a third portion over and contacting jog 22B and possibly gate strip portion 22A (FIG. 5B).

Figure 6:
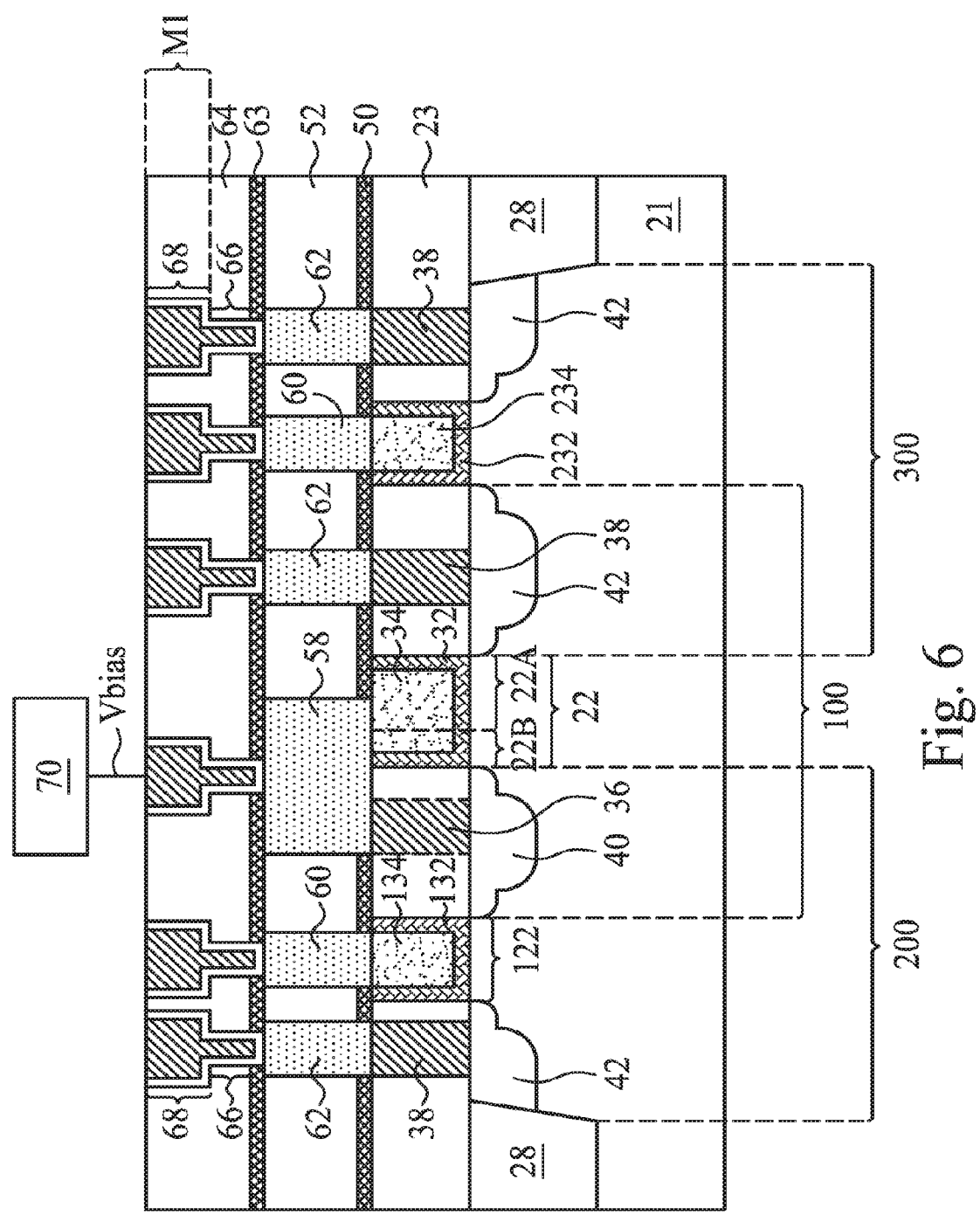

In subsequent processes, as shown in FIG. 6, ESL 63, M0 vias 66, and metal lines 68 are formed in bottom metal layer M1. M0 vias 66 and metal lines 68 are formed in dielectric layer 64, wherein dielectric layer 64 may be formed of a low-k dielectric material having a k value smaller than about 3.0, or smaller than about 2.5, for example. In some embodiments, M0 vias 66 and metal lines 68 are formed using a dual-damascene process, and hence no noticeable interfaces are formed between M0 vias 66 and the respective overlying metal lines 68. In alternative embodiments, M0 vias 66 are formed using a single-damascene process, and metal lines 68 may also be formed using a single-damascene process. In a subsequent process, more metal layers (not shown) may be formed over metal layer M1. M0 vias 66 and metal lines 68 may include a diffusion barrier layer and a copper-containing material over the diffusion barrier layer.

Gate strip 22, M0_OD1 36, and contact plug 58 may form an isolation structure by turning off the MOS transistor 100 that include gate electrode 34 as the gate. In these embodiments, voltage Vbias that is provided to gate electrode 34 may be connected to VSS, which may be the electrical ground when the respective transistor 100 is an NMOS transistor. Voltage Vbias may be provided by voltage source 70, which is configured to provide the constant voltage Vbias for turning off MOS transistor 100. In other embodiments, voltage Vbias may be a positive voltage lower than the threshold voltage of the MOS transistor. Alternatively, voltage Vbias that is provided to gate electrode 34 may be connected to VDD when the respective transistor is a PMOS transistor. On the other hand, gate electrodes 134 and 234 and source/drain regions 42 may form functional MOS transistors 200 and 300 that may be turned on and off depending on the voltage applied thereon. MOS transistor 100 thus acts as the isolation structure for MOS transistors 200 and 300.

In the embodiments, by forming jog 22B, the right edge of contact plug 58 may be designed to be shifted to the left (FIG. 6) without the concern that contact plug 58 will not be electrically connected to gate electrode 34. The process window is thus increased. Accordingly, with contact plug 58 already shifted to the left, even if process variation occurs, and contact plug 58 is undesirably shifted toward right, contact plug 58 will not be adversely shifted to the right of the right edge of gate strip 22A. This avoids the problem that when contact plug 58 is undesirably shifted to the right of the right edge of gate strip 22A, in the formation of the opening for filling contact plug 58, ILD 23 may be etched through, and contact plug 58 may be shorted to source/drain region 42 that is on the right side of gate electrode 34.

In accordance with embodiments, a device includes an active region in a semiconductor substrate, a gate strip over and crossing the active region, and a jog over the active region and connected to the gate strip to form a continuous region. The jog is on a side of the gate strip. A first contact plug is at a same level as the gate strip, wherein the first contact plug is on the side of the gate strip. A second contact plug is over the jog and the first contact plug. The second contact plug electrically interconnects the first contact plug and the jog.

In accordance with other embodiments, a device includes an active region in a semiconductor substrate. A first gate strip, a second gate strip, and a third gate strip are parallel to each other, and are over and crossing the active region, wherein the second gate strip is between the first gate strip and the second gate strip. A jog is over the active region and connected to the second gate strip. The jog is between the first gate strip and the second gate strip. The jog and the second gate strip in combination include a continuous gate electrode, and a continuous gate dielectric including a first portion overlapped by the continuous gate electrode and a second portion on a sidewall of the continuous gate electrode. A source/drain region is in the active region and between the first gate strip and the second gate strip. A first contact plug is at a same level as the gate strip, wherein the first contact plug is over and connected to the source/drain region. A second contact plug is over, and interconnecting, the first contact plug and the jog.

In accordance with yet other embodiments, a method includes forming a gate strip of a MOS device. The MOS device includes a strip portion and a jog over an active region. The strip portion and the jog in combination include a continuous gate electrode having a first portion in the strip portion and a second portion in the jog, and a continuous gate dielectric having a first portion in the strip portion and a second portion in the jog. The method further includes forming a first ILD, with the gate strip being in the first ILD, forming a first contact plug in the first ILD and connected to a source/drain region of the MOS device, forming a second ILD over the first ILD, and forming an opening in the second ILD. A portion of the first contact plug, a portion of the jog, and a portion of the first ILD between the jog and the first contact plug are exposed through the opening. The opening is filled to form a second contact plug.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a semiconductor region comprising a first and a second source/drain region therein;
    isolation regions on opposite sides of the semiconductor region;
    an Inter-Layer Dielectric (ILD) over the semiconductor region and the isolation regions;
    a gate strip comprising:
        a first portion having a substantially uniform width crossing the semiconductor region and further extending over portions of the isolation regions on opposite sides of the semiconductor region; and
        a second portion protruding laterally toward the first source/drain region, with an entirety of the second portion being overlapping the semiconductor region;
    a first contact plug over and electrically connected to the first source/drain region, wherein both the first contact plug and the gate strip extend into the ILD; and
    a second contact plug extending over and electrically connected to the gate strip and the first contact plug.

2. The device of claim 1, wherein the second contact plug comprises:
    a first bottom surface in contact with a top surface of the second portion of the gate strip;
    a second bottom surface in contact with a top surface of the first contact plug; and a third bottom surface in contact with a top surface of the ILD, wherein the third bottom surface connects the first bottom surface to the second bottom surface.

3. The device of claim 1, wherein the second contact plug further extends directly over the first portion of the gate strip.

4. The device of claim 1, wherein the first contact plug comprises:
   a first portion overlapping and electrically coupling to the first source/drain region; and
   a second portion overlapping a portion of the isolation regions.

5. The device of claim 1, wherein the second contact plug comprises an L-shaped portion comprising:
   a first leg overlapping and electrically coupling to the second portion of the gate strip; and
   a second leg overlapping and electrically coupling to the first contact plug.

6. The device of claim 1, wherein the gate strip comprises:
   a gate electrode comprising a first part and a second part in the first portion and the second portion, respectively, of the gate strip, wherein the first part and the second part of the gate electrode are continuously connected to each other; and
   a gate dielectric comprising sidewall portions on sidewalls of the gate electrode.

7. The device of claim 1, wherein the gate strip is free from protruding portions protruding laterally toward the second source/drain region.

8. A device comprising:
   a semiconductor region comprising a source/drain region therein;
   isolation regions on opposite sides of the semiconductor region;
   an Inter-Layer Dielectric (ILD) over the semiconductor region and the isolation regions;
   a gate strip comprising:
      a first portion having a substantially uniform width crossing the semiconductor region and further extending over portions of the isolation regions on opposite sides of the semiconductor region; and
      a second portion on a side of the first portion, with an entirety of the second portion being overlapping the semiconductor region, wherein the first portion and the second portion are connected to each other;
   a first contact plug over and electrically connected to the source/drain region, wherein both the first contact plug and the gate strip extend into the ILD; and
   a second contact plug comprising:
      a first bottom surface in contact with a top surface of the second portion of the gate strip; and
      a second bottom surface in contact with a top surface of the first contact plug.

9. The device of claim 8, wherein the second contact plug further comprises a third bottom surface in contact with a top surface of the ILD, wherein the third bottom surface connects the first bottom surface to the second bottom surface.

10. The device of claim 8, wherein the second contact plug further comprises a portion overlapping the first portion of the gate strip.

11. The device of claim 8, wherein the first contact plug comprises:
    a first portion overlapping and electrically coupling to the source/drain region; and
    a second portion overlapping a portion of the isolation regions.

12. The device of claim 8, wherein the second contact plug comprises an L-shaped portion comprising:
    a first leg overlapping and electrically coupling to the second portion of the gate strip; and
    a second leg overlapping and electrically coupling to the first contact plug.

13. The device of claim 8, wherein the gate strip comprises a gate electrode, and the gate electrode comprises a first part and a second part in the first portion and the second portion, respectively, of the gate strip, wherein the first part and the second part of the gate electrode are continuously connected to each other.

14. The device of claim 13, wherein the gate strip further comprises a gate dielectric comprising sidewall portions on sidewalls of the gate electrode.

15. A device comprising:
    isolation regions extending into a semiconductor substrate;
    a semiconductor region between opposite portions of the isolation regions;
    an Inter-Layer Dielectric (ILD) over the semiconductor region and the isolation regions;
    a gate strip comprising:
       a first portion with a substantially uniform width crossing the semiconductor region and further extending over the opposite portions of the isolation regions; and
       a second portion on a side of the first portion, with an entirety of the second portion being overlapping the semiconductor region, wherein the first portion and the second portion are connected to each other;
    a first source/drain region and a second source/drain region on opposite sides of the gate strip, wherein the first source/drain region and the second source/drain region extend into the semiconductor region;
    a first contact plug comprising a first portion overlapping a portion of the first source/drain region, and a second portion overlapping a portion of the isolation regions; and
    a second contact plug, wherein a entirety of the second contact plug overlaps the second source/drain region.

16. The device of claim 15 further comprising a third contact plug, wherein the third contact plug comprises:
    a first bottom surface in contact with a top surface of the second portion of the gate strip; and
    a second bottom surface in contact with a top surface of the first contact plug.

17. The device of claim 16, wherein the third contact plug further comprises a third bottom surface in contact with a top surface of the ILD.

18. The device of claim 15, wherein in a top view of the device, the second portion of the gate strip has a first distance to a first edge of the portion of the isolation regions, and the first contact plug has a second edge overlapping the first source/drain region, and the second edge of the second contact plug is parallel to the first edge, with the first edge and the second edge having a second distance smaller than the first distance.

19. The device of claim 15, wherein the first portion of the gate strip extends to overlap portions of the isolation regions that are on opposite sides of the gate strip.

20. The device of claim 15, wherein the first contact plug and the second contact plug are electrically coupled to the first source/drain region and the second source/drain region, respectively.

* * * * *